United States Patent
Yang et al.

(10) Patent No.: US 8,108,159 B2
(45) Date of Patent: Jan. 31, 2012

(54) METHOD OF DETECTING DEGRADATION OF SEMICONDUCTOR DEVICES AND METHOD OF DETECTING DEGRADATION OF INTEGRATED CIRCUITS

(75) Inventors: Gi-Young Yang, Gyeonggi-do (KR); Chi-Hwan Lee, Daegu (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 679 days.

(21) Appl. No.: 12/234,465

(22) Filed: Sep. 19, 2008

(65) Prior Publication Data

US 2009/0082978 A1 Mar. 26, 2009

(30) Foreign Application Priority Data

Sep. 20, 2007 (KR) .................. 10-2007-0095594

(51) Int. Cl.
*H01L 21/3205* (2006.01)

(52) U.S. Cl. .......... 702/58; 438/535; 438/627; 438/585; 438/643; 438/536; 438/795; 438/550

(58) Field of Classification Search ............... 257/311, 257/314, E21.158, E27.132, E21.573, E21.531, 257/E21.619, E21.682, E29.162, E27.103; 438/781, 264, 288, 287, 308, 257–263, 778, 438/18, 17, 902, 904, 535, 627, 585, 643, 438/536, 795, 550; 703/14, 15; 324/719, 324/762.09; 702/58
See application file for complete search history.

(56) References Cited

U.S. PATENT DOCUMENTS

| | | | | |
|---|---|---|---|---|
| 5,361,235 A * | 11/1994 | Kodama | ............... | 365/185.19 |
| 5,886,905 A * | 3/1999 | Yokozawa | .............. | 703/14 |
| 6,187,632 B1 * | 2/2001 | Shuto et al. | ............... | 438/257 |
| 6,187,665 B1 * | 2/2001 | Chetlur et al. | ............ | 438/627 |
| 6,191,445 B1 * | 2/2001 | Fujiwara | ................ | 257/321 |
| 6,246,075 B1 * | 6/2001 | Su et al. | ................ | 257/48 |
| 6,632,729 B1 * | 10/2003 | Paton | ................ | 438/535 |
| 6,969,618 B2 * | 11/2005 | Mouli | ................ | 438/4 |
| 7,106,088 B2 | 9/2006 | Tsai et al. | | |
| 7,186,619 B2 * | 3/2007 | King | ................... | 438/275 |
| 7,525,145 B2 * | 4/2009 | Shukuri | ................ | 257/311 |
| 7,685,543 B2 * | 3/2010 | Tsuji et al. | ............. | 716/106 |
| 7,795,731 B2 * | 9/2010 | Park et al. | .............. | 257/750 |
| 2005/0040840 A1 * | 2/2005 | Kang et al. | ............. | 324/765 |
| 2006/0273401 A1 * | 12/2006 | Tsujikawa et al. | ........ | 257/369 |
| 2007/0023814 A1 * | 2/2007 | Cho | ....................... | 257/314 |
| 2007/0034966 A1 * | 2/2007 | Kim et al. | ............... | 257/369 |
| 2008/0217679 A1 * | 9/2008 | Wu | ........................ | 257/324 |
| 2009/0322371 A1 * | 12/2009 | Brederlow et al. | ........ | 324/765 |
| 2010/0155806 A1 * | 6/2010 | Fourches | ................ | 257/315 |

FOREIGN PATENT DOCUMENTS

| JP | 11330464 A | * | 11/1999 |
|---|---|---|---|
| JP | 2002-016247 | | 1/2002 |
| KR | 2000-0066562 | | 11/2000 |
| KR | 2000-0042108 | | 12/2000 |

* cited by examiner

*Primary Examiner* — Carol Tsai

(74) *Attorney, Agent, or Firm* — Harness, Dickey & Pierce, P.L.C.

(57) ABSTRACT

A method of detecting a degradation of a semiconductor device including calculating a first number of first traps accumulated in a gate insulation layer of the semiconductor device over an operation time of the semiconductor device; calculating the second number of second traps accumulated at an interface between the gate insulation layer and a substrate over the operation time; and calculating the degradation of the semiconductor device relative to the operation time using the first number of the first traps and the second number of the second traps.

23 Claims, 7 Drawing Sheets

US 8,108,159 B2

METHOD OF DETECTING DEGRADATION OF SEMICONDUCTOR DEVICES AND METHOD OF DETECTING DEGRADATION OF INTEGRATED CIRCUITS

CROSS-REFERENCE TO RELATED APPLICATIONS

This application claims priority under 35 U.S.C. §119 to Korean patent Application No. 2007-95594, filed on Sep. 20, 2007 in the Korean Intellectual Property Office (KIPO), the contents of which are herein incorporated by reference in their entirety.

BACKGROUND

1. Technical Field

Embodiments relate to detecting the degradation of a semiconductor device and detecting the degradation of an integrated circuit having the semiconductor device. In particular, embodiments relate to detecting the degradation of a semiconductor device such as a metal oxide semiconductor (MOS) transistor caused by stress generated in the operation of the semiconductor device, and detecting the degradation of an integrated circuit having the semiconductor device.

2. Description of the Related Art

Semiconductor devices have become highly integrated, requiring minute patterns and/or wirings to ensure a high degree of integration. The semiconductor device generally includes a MOS transistor as a unit element. While operating the semiconductor device, the degradation of the MOS transistor can occur due to stress generated in the operation of the semiconductor device. When the semiconductor device operates continuously for a long time, the semiconductor device can become degraded such that the semiconductor device does not satisfy desired user requirements.

Accordingly, it is necessary to detect the degree of degradation of the semiconductor device in the operation of the semiconductor device. To detect the degradation of the semiconductor device, the degradations of individual unit elements in the semiconductor device can be detected. Then, the effect of the degradations of the unit elements relative to the degradation of the semiconductor device is analyzed. When the effect of the degradations of the unit elements relative to the degradation of the semiconductor device is analyzed, the operation characteristics and the reliability of the semiconductor device can be improved.

Generally, the main factor causing the reliability degradation of the MOS transistor can be recognized as hot carrier injection of the MOS transistor. While continuously operating the MOS transistor, electrons and/or holes having high energy are injected to a gate insulation layer of the MOS transistor. The electrons and/or holes are caused by the high electric field generated adjacent to the drain region of the MOS transistor. Since the gate insulation layer has numerous trap sites, the injected electrons can be trapped into the trap sites in the gate insulation layer. Thus, the characteristics of the gate insulation layer can be changed by the electrons trapped therein thereby deteriorating the performance of the MOS transistor. When the performance of the MOS transistor has deteriorated, the semiconductor device can be degraded. For example, the RC delay of the semiconductor device can be increased and the lifetime of the semiconductor device can be reduced.

In addition, the degradation of the MOS transistor can occur based on other factors besides the hot carrier injection, such as a strained offset stress degradation, a FN stress degradation or a negative bias temperature instability (NBTI) degradation. Further, the degradation of the MOS transistor caused by other factors can become important in accordance with the high integration of the semiconductor device. Hence, the degradation of the MOS transistor caused by other factors, are considered when the degradation of the MOS transistors is detected. The strained offset stress degradation of the MOS transistor can be caused by drain voltage induced stress while the MOS transistor is turned off. Further, the FN stress degradation can occur when the drain voltage is not properly applied to the MOS transistor and the MOS transistor is turned on. Therefore, to detect the degradation of the semiconductor device, each of the individual degradation mechanisms caused by the stress can be investigated. The reliability of the semiconductor device can be guaranteed by analyzing the degradation mechanisms of the individual unit elements.

However, the mutual effect among the individual degradation mechanisms cannot be properly considered when the degradation of the semiconductor device is predicted. Thus, the degradation of the semiconductor device cannot be correctly predicted based on the individual degradation mechanisms of the unit elements. Particularly, the degradations of the unit elements in the semiconductor device can simultaneously occur through the individual degradation mechanisms while operating the semiconductor device. Therefore, the reliability and operation characteristics of the semiconductor device cannot be precisely detected though the individual degradation mechanisms of the unit elements in the semiconductor device.

SUMMARY

An embodiment includes a method of detecting a degradation of a semiconductor device including calculating a first number of first traps accumulated in a gate insulation layer of the semiconductor device over an operation time of the semiconductor device; calculating the second number of second traps accumulated at an interface between the gate insulation layer and a substrate over the operation time; and calculating the degradation of the semiconductor device relative to the operation time using the first number of the first traps and the second number of the second traps.

Another embodiment includes a method of detecting a degradation of a transistor including determining a first time period of applying at least one voltage in accordance with an operation mode of the transistor; measuring a number of first traps generated in a gate insulation layer of the transistor during the first time period; measuring a number of second traps generated at an interface between the gate insulation layer and a substrate during the first time period; calculating a first number of the first traps and a second number of the second traps over an operation time of the transistor using the measured number of the first traps and the measured number of the second traps during the first period; and calculating the degradation of the transistor relative to the operation time using the first number of the first traps and the second number of the second traps.

Another embodiment includes a method of detecting a degradation of an integrated circuit including calculating a first number of first traps accumulated in gate insulation layers of transistors with respect to voltages applied to the transistors and operation times of the transistors; calculating a second number of second traps accumulated at interfaces between the gate insulation layers and a substrate with respect to the voltages applied to the transistors and the operation times of the transistors; calculating degradations of the transistors over the operation times using the first number of the first traps and the second number of the second traps; and calculating the degradation of the integrated circuit using the degradations of the transistors.

BRIEF DESCRIPTION OF THE DRAWINGS

Embodiments will be described in detailed with reference to the accompanying drawings, in which.

DETAILED DESCRIPTION OF THE EMBODIMENTS

Figure 1:
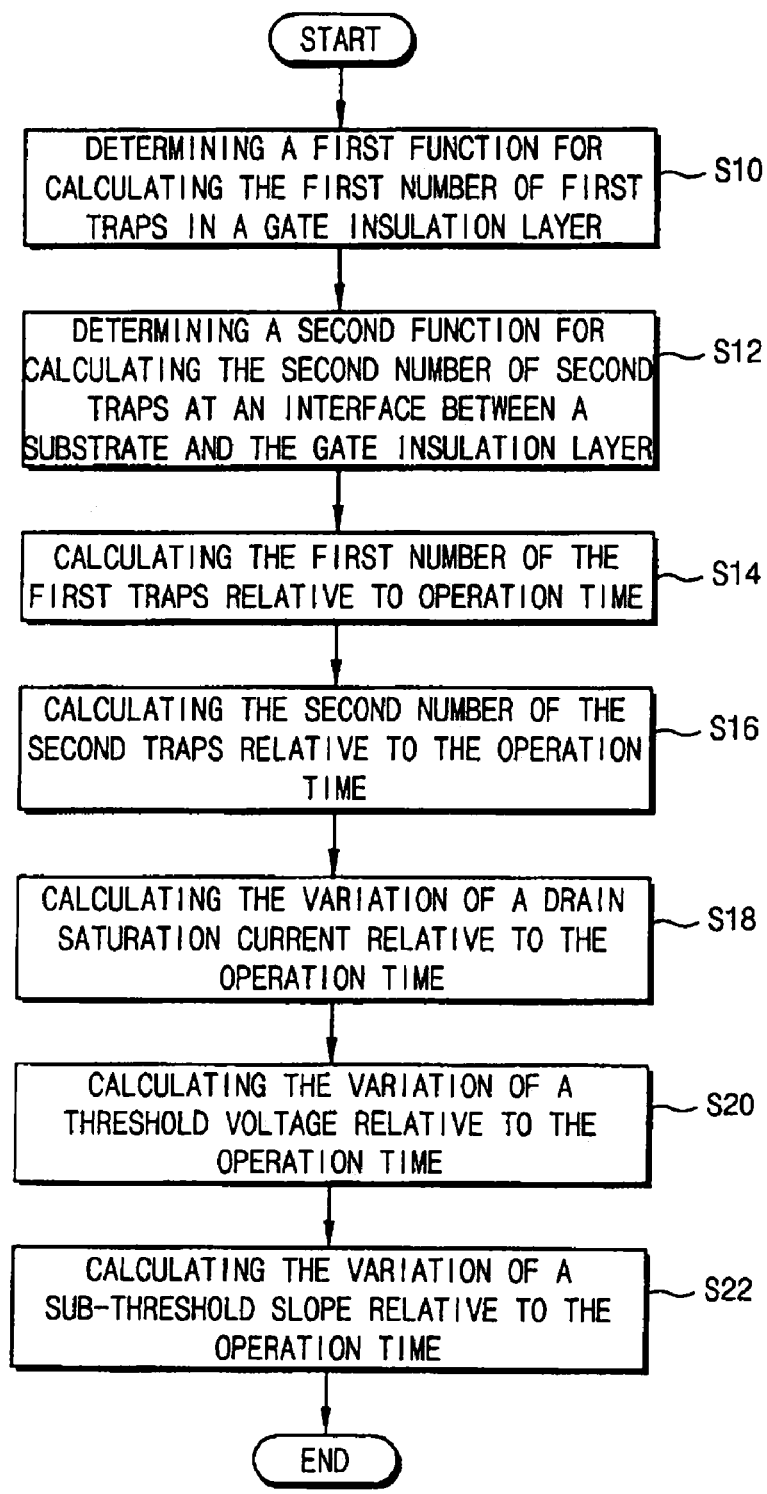
FIG. 1 is a flow chart illustrating a method of detecting the degradation of a semiconductor device according to an embodiment.

Embodiments are described more fully hereinafter with reference to the accompanying drawings. The invention may, however, be embodied in many different forms and should not be construed as limited to the example embodiments set forth herein. Rather, these example embodiments are provided so that this disclosure will be thorough and complete, and will fully convey the scope of the invention to those skilled in the art. In the drawings, the sizes and relative sizes of layers and regions can be exaggerated for clarity.

It will be understood that when an element or layer is referred to as being "on," "connected to" or "coupled to" another element or layer, it can be directly on, connected or coupled to the other element or layer or intervening elements or layers can be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. can be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device can be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of illustratively idealized example embodiments (and intermediate structures) of the invention. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation can result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flow chart illustrating a method of detecting the degradation degree of a semiconductor device according to an embodiment. Although FIG. 1 illustratively describes a method of detecting the degradation degree of a metal oxide semiconductor (MOS) transistor, the features of the invention can be employed in other semiconductor devices. Similarly, any discussion herein can be applied to any type of transistors.

Referring to FIG. 1, a first function for calculating the first number ($N_{ot}$) of first traps generated in a gate insulation layer of the MOS transistor is determined in S10. When the first number ($N_{ot}$) of the first traps is obtained, the first density of the first traps in the gate insulation layer can be determined according to the first number ($N_{ot}$) of the first traps.

The first function can be determined using a gate voltage, a drain voltage and a bulk voltage as parameters. The gate and the drain voltages can be applied to a gate electrode and a drain of the MOS transistor. Further, the bulk voltage can be applied to a substrate. The first function can be determined from the first number ($N_{ot}$) of the first traps generated in the gate insulation layer according as the voltages are input to the MOS transistor.

In an embodiment, the gate insulation layer can include an oxide such as silicon oxide or a metal oxide having a high dielectric constant such as hafnium oxide, zirconium oxide, tantalum oxide, aluminum oxide, or the like. The gate electrode can include doped polysilicon, a metal and/or a metal compound. For example, the gate electrode can include polysilicon doped with impurities, tungsten, titanium, aluminum, tantalum, copper, aluminum nitride, tungsten nitride, titanium nitride, etc. Further, the substrate can include a semiconductor substrate such as a silicon substrate, a germanium substrate, a silicon germanium substrate, etc. Alternatively, the substrate can include a silicon-on-insulator (SOI) substrate or a germanium-on-insulator (GOI) substrate.

S12 includes determining a second function for calculating the second number ($N_{it}$) of second traps generated at an interface between the gate insulation layer and the substrate. The second density of the second traps can be obtained in accordance with the second number ($N_{it}$) of the second traps. The second function can also be obtained using the voltages applied to the MOS transistor as the parameters. The second function can be determined from the second number ($N_{it}$) of the second traps formed at the interface between the substrate and the gate insulation layer in accordance with the voltages input to the MOS transistor.

In an embodiment, the gate, the drain and the bulk voltages can be applied to the gate electrode, the drain and the substrate through input terminals of the MOS transistor. For example, voltages including logic signals of opposite phases can be applied to the gate electrode and the drain of the MOS transistor. Further, toggled signals can be repeatedly input to the input terminals of the MOS transistor over time. The toggled signal can correspond to a signal periodically varied between a high level and a low level. In an embodiment, a source of the MOS transistor and the substrate can be grounded. Although particular examples have been given for applied voltages, other voltages can be applied. For example, if the transistor is a different type of transistor, includes additional terminals, or the like, additional or different voltages can be applied. The applied voltages can be any voltages that can be applied to the transistor.

The first density of the first traps generated in the gate insulation layer can be measured with respect to the applied voltage and an operation time. The first density of the first traps can be obtained based on the first number ($N_{ot}$) of the first traps accumulated in the gate insulation layer. For example, the numbers of the first traps formed in the gate insulation layer can be measured relative to a time interval ($\Delta t$), and then the numbers of the first traps accumulated in the gate insulation layer can be added to obtain the first number ($N_{ot}$) of the first traps for the first density of the first traps in the gate insulation layer.

The second density of the second traps formed at the interface between the substrate and the gate insulation layer can also be measured with respect to the applied voltage and time. Namely, the second density of the second traps can be obtained based on the second number ($N_{it}$) of the second traps accumulated at the interface between the substrate and the gate insulation layer. After the numbers of the second traps at the interface between the substrate and the gate insulation layer can be measured relative to the time interval ($\Delta t$), the numbers of the second traps accumulated at the interface can be added to provide the second number ($N_{it}$) of the second traps for the second density of the second traps at the interface between the substrate and the gate insulation layer.

In an embodiment, the first number ($N_{ot}$) of the first traps and the second number ($N_{it}$) of the second traps can be represented according to the following equations (1) and (2):

$$N_{it}(t_s) = \sum_m N_{it,m}(t_s) \tag{1}$$

$$N_{ot}(t_s) = \sum_m N_{ot,m}(t_s) \tag{2}$$

In the above equation (1), $N_{ot}(t_s)$ and $N_{it}(t_s)$ indicate the first number ($N_{ot}$) of the first traps and the second number ($N_{it}$) of the second traps with respect to operation time, respectively. Further, $N_{ot,m}(t_s)$ and $N_{it,m}(t_s)$ represent the first number ($N_{ot}$) of the first traps and the second number ($N_{it}$) of the second traps relative to a time interval ($\Delta t$).

As the first number ($N_{ot}$) of the first traps can depend on the voltages applied to the gate electrode, the drain, the source and the substrate, the first density of the first traps can be represented as the first function. The first function for calculating the first density of the first traps can be obtained by designating the measured first number ($N_{ot}$) and the voltages into trap model function equations. The trap model function equations have been provided considering various voltages and the number of the objects. For example, the first function can be determined by the following trap model function equations (3)-(5):

$$a(V_d, V_g) = Ae^{BV_d} + Ce^{-DV_d} + \frac{e^{-EV_g}}{\frac{1}{Fe^{GV_d}} + \frac{1}{H}} \tag{3}$$

$$b(V_d, V_g) = I(V_g)^J e^{-KV_g} + Le^{MV_g} + N \tag{4}$$

$$N_{ot}(V_d, V_g, t) = a(V_d, V_g) \times b(V_d, V_g) \times t^{n1} \tag{5}$$

In the above equations (3)-(5), $V_d$ and $V_g$ denote the voltage applied to the gate electrode of the MOS transistor and the voltage applied to the drain of the MOS transistor, respectively. In an embodiment, the determination of a particular function can include the determination of the parameters A-N above according to the variation of the applied voltages.

Since the second number ($N_{it}$) of the second traps can also depend on the voltages applied to the gate electrode, the drain, the source and the substrate, the second density of the second traps can be indicated by the second function. The second function can be determined using an equation substantially the same as the above equations (3)-(5). That is, the second function for calculating the second density of the second traps can be obtained using the trap model function equations (3)-(5).

Referring now to FIG. 1, the first number ($N_{ot}$) of the first traps relative to time is calculated using the first function and first time (i.e., the first operation time of the MOS transistor) in S14. In S16, the second number ($N_{it}$) of the second traps relative to time is calculated based on the second function and second time (i.e., the second operation time of the MOS transistor).

In an embodiment, the first number ($N_{ot}$) of the first traps and the second number ($N_{it}$) of the second traps relative to time can be represented by the following equations (6) and (7):

$$N_{it,m} = f_m(V_d, V_g, V_b) t^{n1} \qquad (6)$$

$$N_{ot,m} = g_m(V_d, V_g, V_b) t^{n2} \qquad (7)$$

In the above equations (6) and (7), $g_m$ and $f_m$ mean the first function and the second function, respectively. Further, $t^{n2}$ and $t^{n1}$ indicate the first operation time and the second operation time.

In an embodiment, the first number ($N_{ot}$) of the first traps can be indicated as the exponential function including the first function and the first time. Additionally, the second number ($N_{it}$) of the second traps can also be represented as the exponential function including the second functions and the second time. Although the exponential functions can vary in accordance with the electrical characteristics of the MOS transistor, the exponential functions can be substantially the same when MOS transistors have substantially the same electrical characteristics.

As describe above, the first number ($N_{ot}$) of the first traps and the second number ($N_{it}$) of the second traps are determined through the first and the second functions and the first and the second times. The first number ($N_{ot}$) of the first traps and the second number ($N_{it}$) of the second traps can have constant values without reference to individual degradation mechanisms of the MOS transistor such as hot carrier injection, offset stress, F-N stress, negative bias temperature instability, etc. For example, the first number ($N_{ot}$) of the first traps and the second number ($N_{it}$) of the second traps can be substantially the same as the sum of the number of traps caused by the individual degradation mechanisms.

In the individual degradation mechanisms, the hot carrier injection can occur during the operation of the MOS transistor, and the offset stress can occur when the gate of the MOS transistor is turned off. Further, the FN stress and the negative bias temperature instability can occur when the gate of the MOS transistor is turned on and the voltage is not applied to the drain of the MOS transistor.

Figure 2:
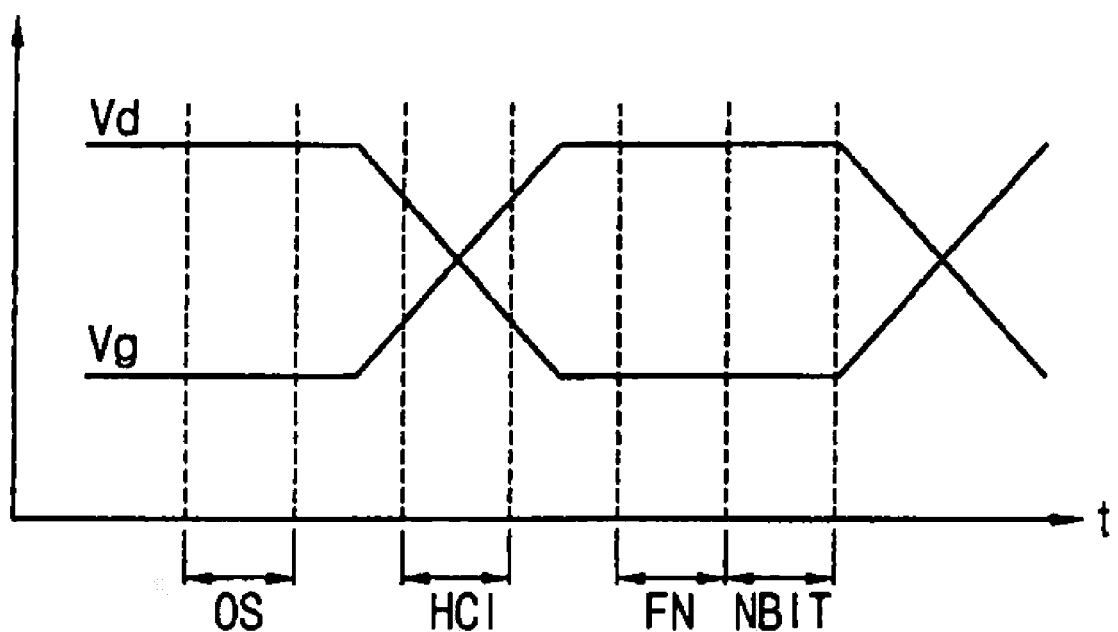
FIG. 2 is a signal timing diagram illustrating gate and drain voltages applied to a MOS transistor according to an embodiment.

FIG. 2 is a signal timing diagram illustrating gate and drain voltages applied to a MOS transistor according to an embodiment. In FIG. 2, "$V_d$" and "$V_g$" indicate the gate and the drain voltages applied to the gate and the drain of the MOS transistor, respectively. "OS" indicates a condition when the degradation is caused by the offset stress. "HCI" indicates a condition when the degradation is due to the hot carrier injection. Furthermore, "FN" and "NBIT" indicate the conditions when the degradations are caused by the F-N stress and the negative temperature bias temperature, respectively.

As illustrated in FIG. 2, the degradations of the MOS transistor can be caused by different degradation mechanisms when the gate voltage ($V_g$) and the drain voltage ($V_d$) are applied to the MOS transistor. However, the first number ($N_{ot}$) of the first traps and the second number ($N_{it}$) of the second traps can be calculated regardless of the individual degradation mechanisms with respect to the time.

In S18, a third function for calculating the variation ($\Delta I_{dst}$) of a drain saturation current relative to time is determined using the first number ($N_{ot}$) of the first traps and the second number ($N_{it}$) of the second traps. The variation ($\Delta I_{dst}$) of the drain saturation current relative to the time is calculated using the third function. The third function can depend on the first number ($N_{ot}$) of the first traps and the second number ($N_{it}$) of the second traps.

In S20, a fourth function for calculating the variation ($\Delta V_{th}$) of a threshold voltage relative to time is determined using the first number ($N_{ot}$) of the first traps and the second number ($N_{it}$) of the second traps. The fourth function can also depend on the first number ($N_{ot}$) of the first traps and the second number ($N_{it}$) of the second traps with respect to time. The variation ($\Delta V_{th}$) of the threshold voltage of the MOS transistor can be obtained using the fourth function.

In S22, a fifth function for calculating the variation ($\Delta SW$) of a sub-threshold slope relative to time is determined using the first number ($N_{ot}$) of the first traps and the second number ($N_{it}$) of the traps. The fifth function can also depend on the first number ($N_{ot}$) of the first traps and the second number ($N_{it}$) of the traps. The variation ($\Delta SW$) of the sub-threshold slope of the MOS transistor can be calculated using the fourth function.

In an embodiment, the variations ($\Delta I_{dst}$) of the drain saturation current, the variation ($\Delta V_{th}$) of the threshold voltage, and the variation ($\Delta SW$) of the sub-threshold slope can be represented using the following equations (8)-(10):

$$\Delta I_{dsat} = h(N_{it}, N_{ot}) \qquad (8)$$

$$\Delta V_{th} = p(N_{it}, N_{ot}) \qquad (9)$$

$$\Delta SW = r(N_{it}, N_{ot}) \qquad (10)$$

In the above equations (8)-(10), $h(N_{it}, N_{ot})$, $p(N_{it}, N_{ot})$ and $r(N_{it}, N_{ot})$ denote the third, the fourth and the fifth functions, respectively.

In an embodiment, there can be an increase in the first number of the first traps at the gate insulation layer and the second number of the second traps at the interface between the substrate and the gate insulation layer as time passes. That is, the first density of the first traps and second density of the second traps can increase with respect to the increase of time. When the first density of the first traps and the second density of the second traps increase, the drain saturation current and the threshold voltage of the MOS transistor can decrease. The variations of the drain saturation current, the threshold voltage and the sub-threshold slope of the MOS transistor can be predicted. Therefore, the degradation of the MOS transistor can be correctly detected.

Figure 3:
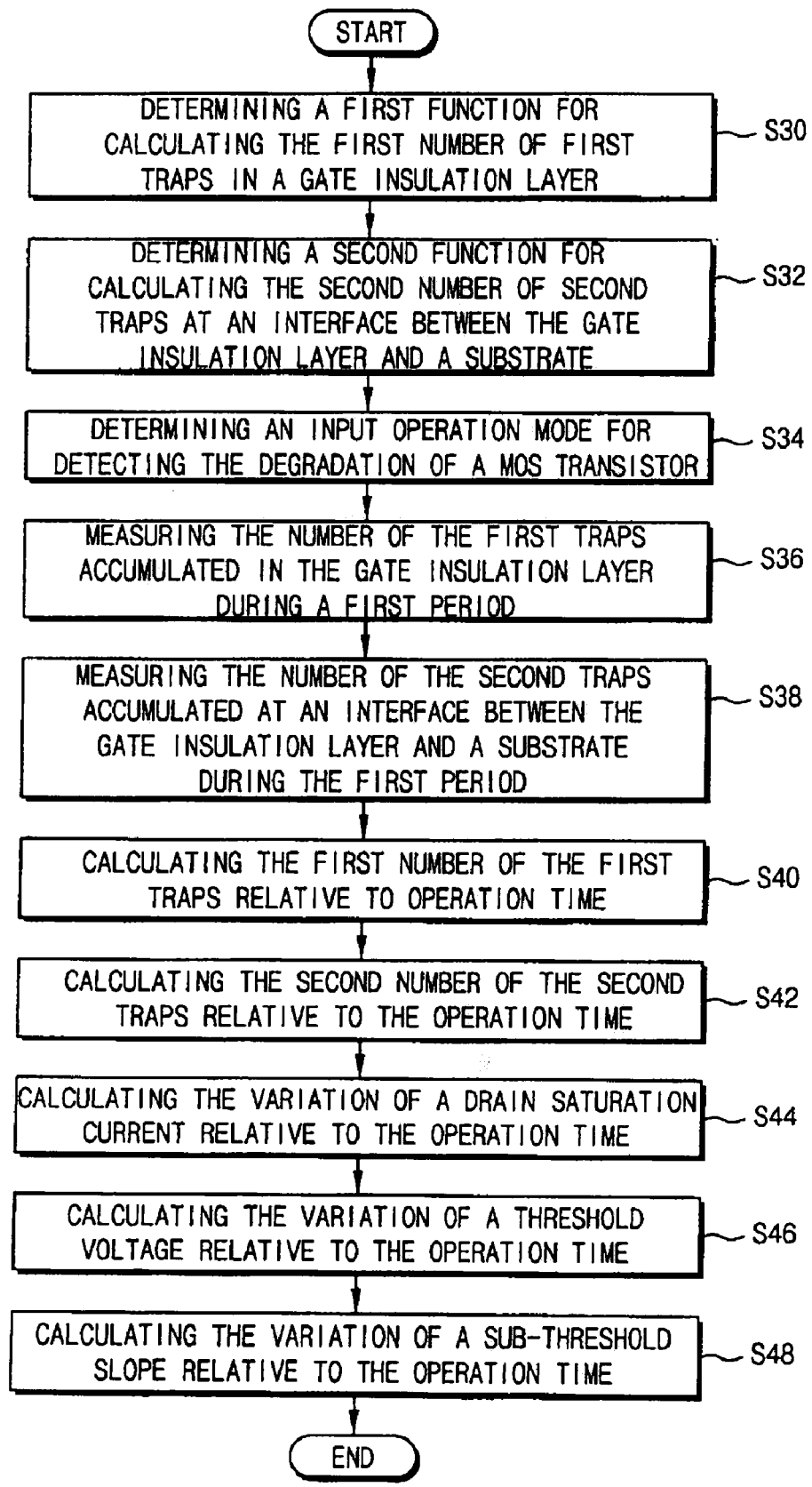
FIG. 3 is a flow chart illustrating a method of detecting the degradation of a semiconductor device according to an embodiment.

FIG. 3 is a flow chart illustrating a method of detecting the degradation of a semiconductor device according to an embodiment. In S30, a first function is determined using a gate voltage, a drain voltage and a bulk substrate voltage in S30. The first number of first traps generated in a gate insulation layer of the MOS transistor can be obtained from the first function. Further, the first density of the first traps is determined from the first number of the first traps. The first function can be determined using applied voltages and the number of the first traps accumulated in the gate insulation layer during an operation time of the MOS transistor. Here, the gate voltage and the drain voltage can be applied to a gate electrode and a drain of the MOS transistor. Further, the bulk substrate voltage can be applied to the bulk substrate. In an embodiment, the first function can be determined through processes substantially the same as or substantially similar to those described with reference to FIG. 1.

In S32, a second function is determined using the gate voltage, the drain voltage, the bulk substrate voltage and the number of second traps accumulated at an interface between the gate insulation layer and the bulk substrate. The second number of the second traps can be obtained from the second function, and thus the second density of the second traps can be determined from the second number of the second traps. The second number of the second traps can be determined through processes substantially the same as or substantially similar to those described with reference to FIG. 1.

In S34, an input operation mode for detecting the degradation of the MOS transistor is determined, so that the degradation modeling of the MOS transistor can be achieved. The input operation mode can be periodically changed. For example, the gate voltage applied to the gate of the MOS transistor can be toggled such as a high level signal and a low level signal can be periodically alternated. Further, the drain voltage applied to the drain of the MOS transistor can be toggled to have a phase opposed to that of the gate voltage.

Figure 4:
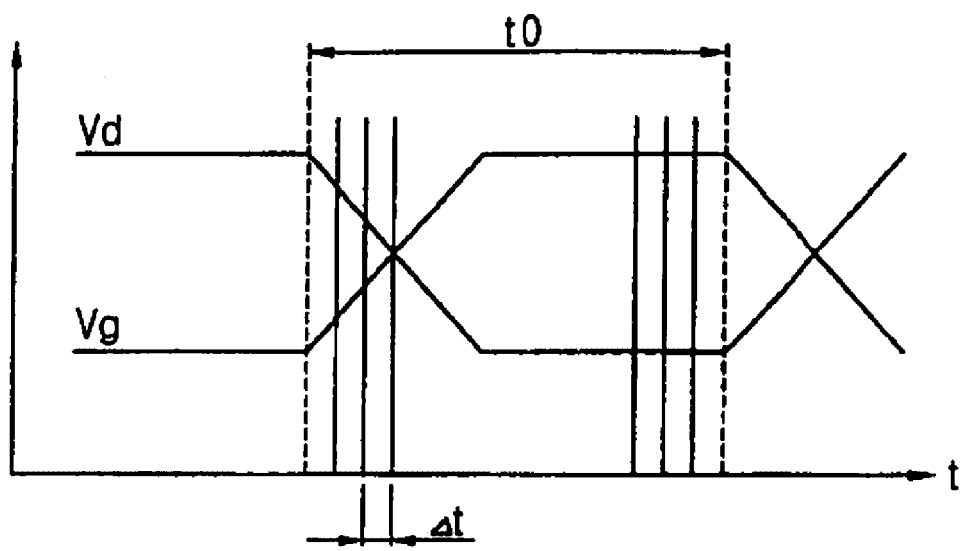
FIG. 4 is a signal timing diagram illustrating an input operation mode for detecting the degradation of a semiconductor device according an embodiment.

FIG. 4 is a signal timing diagram illustrating an input operation mode for detecting the degradation of the semiconductor device such as the MOS transistor. In FIG. 4, "$V_g$" and "$V_d$" correspond to the gate voltage and the drain voltage of the MOS transistor, respectively.

Referring to FIGS. 3 and 4, in S36, the number ($N_{ot}(t0)$) of the first traps accumulated in the gate insulation layer can be measured during a first period (t0) of applying the gate voltage ($V_g$) and the drain voltage ($V_d$). The number ($N_{ot}(t0)$) of the first traps can be calculated using the first function. For example, the number ($N_{ot}(t0)$) of the first traps can be obtained by integrating the numbers of the first traps generated in the gate insulation layer per a time interval ($\Delta t$) in the first period (t0) of the operation of the MOS transistor.

In S38, the number ($N_{it}(t0)$) of the second traps accumulated at the interface between the gate insulation layer and the bulk substrate is measured during the first period of the operation of the MOS transistor. The number ($N_{it}(t0)$) of the second traps relative to the first period can be calculated using the second function. For example, the number of the second traps can be calculated by integrating the second traps generated at the interface between the bulk substrate and the gate insulation layer per the time interval ($\Delta t$) of the first period.

In an embodiment, the number ($N_{ot}(t0)$) of the first traps and the number ($N_{it}(t0)$) and the second traps are presented by the following equations (11) and (12):

$$N_{ot}(t0) = [g_m(V_d, V_g, V_b)]^{1/n2} \Delta t + \ldots \quad (11)$$

$$N_{it}(t0) = [f_m(V_d, V_g, V_b)]^{1/n1} \Delta t + \ldots \quad (12)$$

In the above equations (11) and (12), $g_m$ and $f_m$ indicate the first function and the second function, respectively. Additionally, n1 and n2 denote the measurement numbers of the first and the second traps with respect to a time interval ($\Delta t$). Furthermore, $V_b$ means the bulk substrate voltage applied to the bulk substrate.

In S40, the first number ($N_{ot}(t_s)$) of the first traps is calculated with respect to the operation time ($t_s$) of the MOS transistor. Further, the second number ($N_{it}(t_s)$) of the second traps is calculated with respect to the operation time of the MOS transistor in S42. Thus, the first density of the first traps and the second density of the second traps can be obtained based on the first number ($N_{ot}(t_s)$) of the first traps and the second number ($N_{it}(t_s)$) of the second traps. For example, the first number ($N_{ot}(t_s)$) of the first traps and the second number ($N_{it}(t_s)$) of the second traps relative to the predetermined operation time ($t_s$) can be calculated from the number ($N_{ot}(t0)$) of the first traps and the number ($N_{it}(t_s)$) of the second number using the proportional formulae of time.

In an embodiment, the first number ($N_{ot}(t_s)$) of the first traps and the second number $N_{it}(t_s)$ of the second traps are presented by the following equations (13) and (14):

$$N_{ot}(ts) = \left[N_{ot}(t_s)\frac{t_s}{t0}\right] n2 \quad (13)$$

$$N_{it}(ts) = \left[N_{it}(t_s)\frac{t_s}{t0}\right] n1 \quad (14)$$

The variation of a drain saturation current ($\Delta I_{dst}$), the variation of a threshold voltage ($\Delta V_{th}$), and the variation of a sub-threshold slope ($\Delta SW$) can be calculated using the first number $N_{ot}(t_s)$ of the first traps and the second number $N_{it}(t_s)$ of the second traps. The variation of the drain saturation current ($\Delta I_{dst}$), the variation of the threshold voltage ($\Delta V_{th}$), and the variation of the sub-threshold slope ($\Delta SW$) can be obtained by processes substantially the same or substantially similar to those described with reference to FIG. 1.

In S44, a third function for calculating the variation ($\Delta I_{dst}$) of the drain saturation current is determined using the first number ($N_{ot}(t_s)$) of the first traps and the second number ($N_{ot}(t_s)$) of the second traps, and then the variation ($\Delta I_{dst}$) of the drain saturation current is calculated from the third function. Here, the variation ($\Delta I_{dst}$) of the drain saturation current is obtained with respect to the operation time.

In S46, after a forth function for calculating the variation ($\Delta V_{th}$) of the threshold voltage is determined the first number ($N_{ot}(t_s)$) of the first traps and the second number ($N_{ot}(t_s)$) of the second traps, the variation ($\Delta V_{th}$) of the threshold voltage relative to the operation time is calculated using of the forth function.

In S48, a fifth function for calculating the variation ($\Delta SW$) of the sub-threshold slope is determined using the first number ($N_{ot}(t_s)$) of the first traps and the second number ($N_{ot}(t_s)$) of the second traps, and then the variation ($\Delta SW$) of the sub-threshold slope relative to the operation time is calculated using of the fifth function.

In an embodiment, densities of traps in a gate insulation layer and an interface between the gate insulation layer and a substrate can be calculated with respect to applied voltages such as a gate voltage, a drain voltage and a bulk substrate voltage. Therefore, the variation of the drain saturation current, the variation of the threshold voltage, and the variation of a sub-threshold slope can be correctly detected in accordance with the operation time of the semiconductor device. As a result, the degradation of the semiconductor device such as a MOS transistor can be correctly detected.

Figure 5:
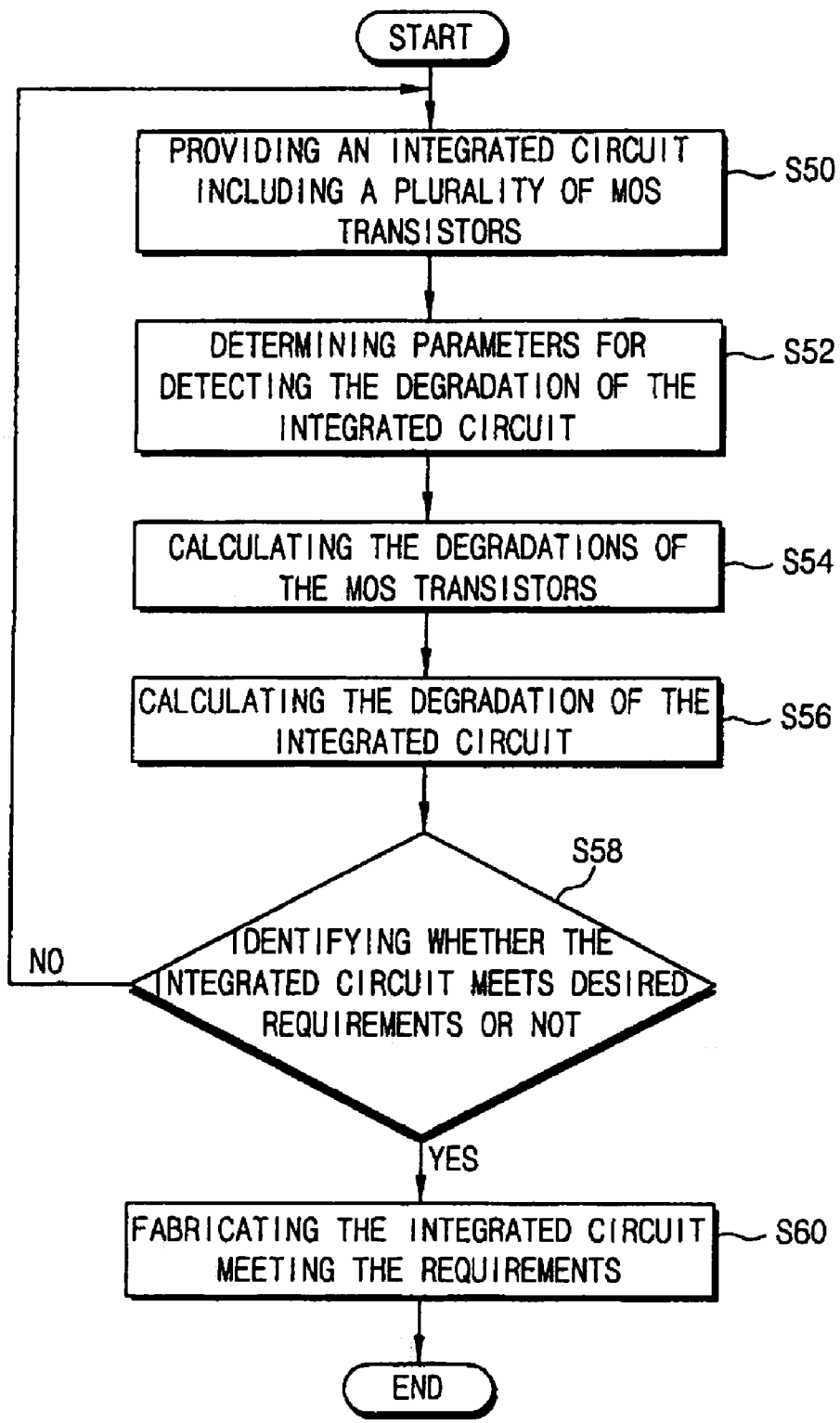
FIG. 5 is a flow chart illustrating a method of detecting the degradation of an integrated circuit according to an embodiment.

FIG. 5 is a flow chart illustrating a method of detecting the degradation of an integrated circuit according to an embodiment. An integrated circuit including multiple MOS transistors is prepared in S50. The MOS transistors can be electrically connected to one another in parallel and/or in serial. At least one parameter is determined to detect the degradation of the integrated circuit. For example, the parameters can include a signal delay time, an operation speed, a combination of such parameters, or the like.

In S52, the parameters for detecting the degradation of the integrated circuit are calculated or measured while operating the integrated circuit in a first operation time. For example, the signal delay time and the operation speed can be calculated or measured in the first operation time.

In S54, the degradations of the MOS transistors are calculated through processes substantially the same as or substantially similar to those described with reference to FIG. 1. The degradations of the MOS transistors can be detected using the variation of a drain saturation current, the variation value of a threshold voltage and a variation of a sub-threshold slope, which are obtained from the first number of first traps generated in gate insulation layers of the MOS transistors and the second number of second traps formed at interfaces of the gate insulation layers and a substrate.

In S56, the degradation of the integrated circuit is calculated based on the individual degradations of the MOS transistors. When voltage and current characteristics of the degraded MOS transistors are different from those of fresh MOS transistors (i.e., the MOS transistors in initial conditions), the signal delay time and the response speed of the integrated circuit including the degraded the MOS transistors can be detected. Thus, a lifetime until an operational failure of the integrated circuit occurs can be determined.

In S58, the integrated circuit is detected to identify whether the integrated circuit satisfies predetermined requirements or not. For example, the integrated circuit can be detected whether the integrated circuit has a life time over 10 years or not. Further, other desired requirements such as a reliability and operation characteristics can be detected.

In S60, the integrated circuit is fabricated when the integrated circuit satisfies the predetermined requirements.

Figure 6:
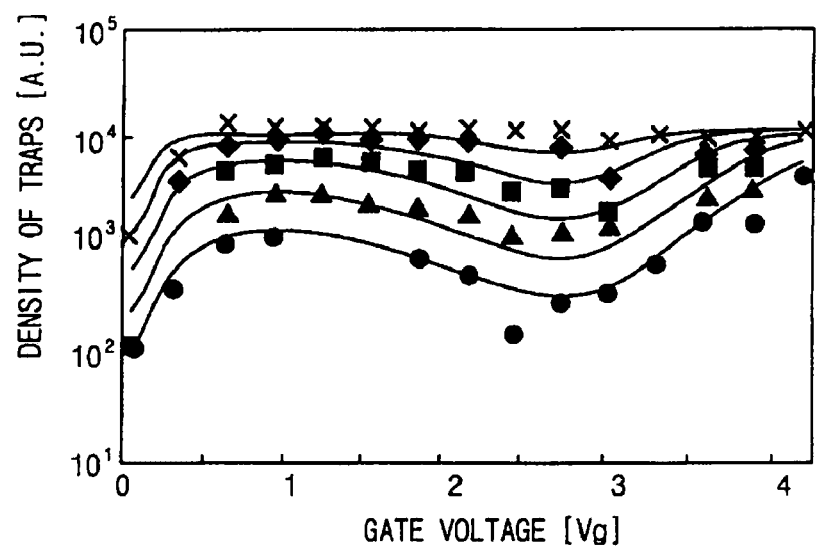
FIG. 6 is a graph illustrating the densities of traps in gate insulation layers of MOS transistors according to an embodiment.

Hereinafter, experimental results for detecting the degradation of a semiconductor device will be described with reference to the accompanying drawings. FIG. 6 is a graph illustrating the densities of traps in gate insulation layers of MOS transistors according to an embodiment. In FIG. 6, symbols of "x", "♦", "■", "▲" and "●" indicate the simulated densities of the traps in the gate insulation layers of five MOS transistors. Solid lines denote the measured densities of the traps in the gate insulation layers of five MOS transistors. The densities of the traps in the gate insulation layers are simulated and measured with respect to gate voltages.

Referring to FIG. 6, the measured densities of the traps in the gate insulation layers are substantially the same as the simulated densities of the traps in the gate insulation layer. Thus, even though the degradation mechanisms of the MOS transistors are various, the degradations of the MOS transistors can be detected based on the densities of the traps regardless of the degradation mechanisms of the MOS transistors.

Figure 7:
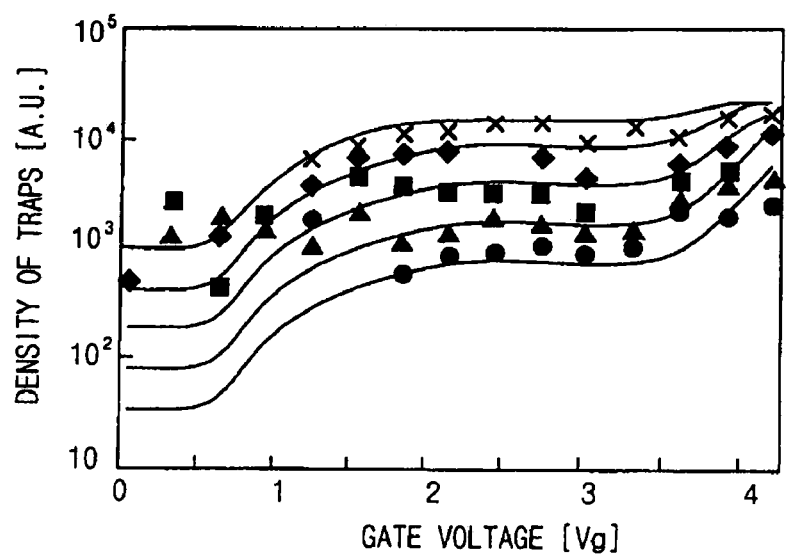
FIG. 7 is a graph illustrating the densities of traps between gate insulation layers of MOS transistors and a substrate according to an embodiment.

FIG. 7 is a graph illustrating the densities of traps between a substrate and gate insulation layers of MOS transistors according to an embodiment. In FIG. 7, symbols of "x", "♦", "■", "▲" and "●" indicate the simulated densities of the traps between the substrate and the gate insulation layers of five MOS transistors. Solid lines denote the measured densities of the traps between the substrate and the gate insulation layers of five MOS transistors. The densities of the traps between the gate insulation layers and the substrate are simulated and measured with respect to gate voltages.

As illustrated in FIG. 7, the measured densities of the traps between the gate insulation layers and the substrate are substantially the same as the simulated densities of the traps between the substrate and the gate insulation layers. As described above, the degradations of the MOS transistors can be detected based on the densities of the traps regardless of the degradation mechanisms of the MOS transistors when the degradation mechanisms of the MOS transistors are various.

Figure 8:
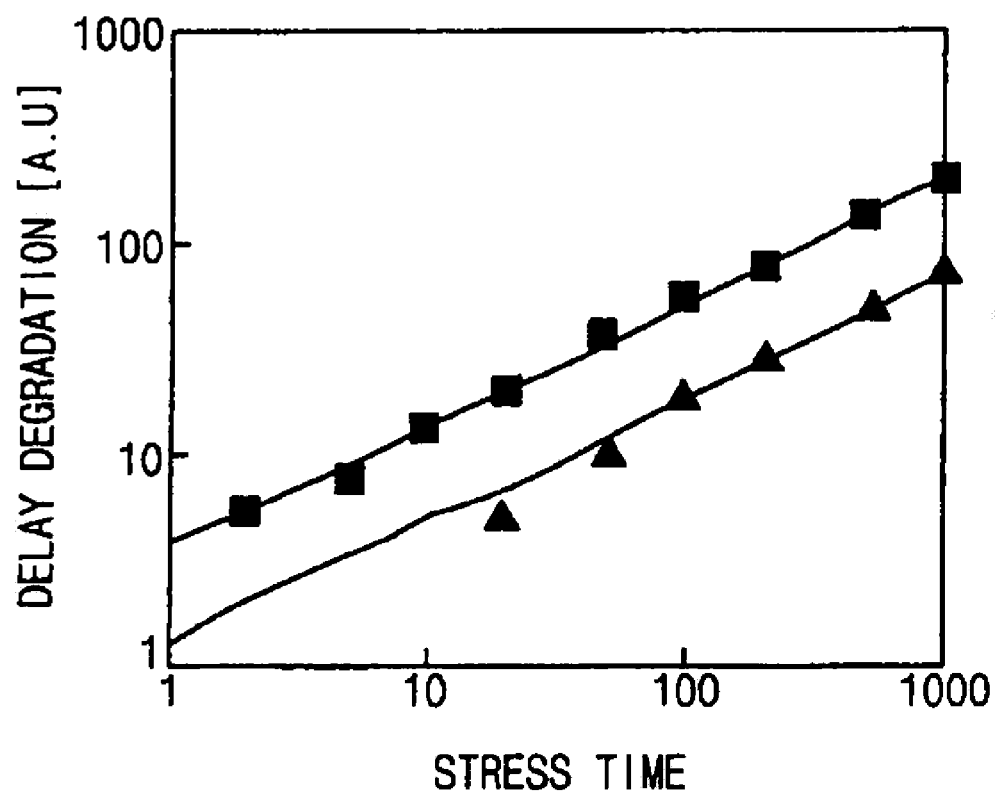
FIG. 8 is a graph illustrating the RC delay degradations of ring oscillators including MOS transistors according to an embodiment.

FIG. 8 is a graph illustrating the RC delay degradations of ring oscillators including MOS transistors according to an embodiment. In FIG. 8, solid lines represent the measured RC delay degradations of the ring oscillator, and symbols of "■" and "▲" indicate the simulated RC delay degradations of the ring oscillator. The ring oscillator can include a plurality of invertors electrically connected to one another. The RC delay degradations of the ring oscillators are simulated and measured with respect to stress time.

Referring FIG. 8, the measured RC delay degradations of the ring oscillator are substantially the same as the simulated RC delay degradations of the ring oscillator. As the result, the delay degradations of an integrated circuit such as the ring oscillator can be detected based on the individual degradations of the MOS transistors.

In an embodiment, the degradation of a semiconductor device such as a MOS transistor can be detected with respect to an operation time of the semiconductor device. Further, the degradation of an integrated circuit having MOS transistors can also be detected based on the detected the degradations of the MOS transistors. As a result, desired requirements of the MOS transistor and the integrated circuit, for example, a life time, a reliability and operation characteristics can be detected.

An embodiment includes a method of detecting the degradation of a semiconductor device such as a MOS transistor. Another embodiment includes a method of detecting the degradation of an integrated circuit including a plurality of MOS transistors.

An embodiment includes a method of detecting a degradation of a semiconductor device. In the method of detecting the degradation of the semiconductor device, the first number of first traps accumulated in a gate insulation layer of the semiconductor device is calculated using applied voltages over an operation time of the semiconductor device. The second number of second traps accumulated at an interface between the gate insulation layer and a substrate is calculated using the applied voltages over the operation time. The degradation of the semiconductor device over the operation time is calculated using the first number of the first traps and the second number of the second traps.

In an embodiment, in the calculation of the first number of the first traps, the numbers of the first traps generated in the gate insulation layer can be measured using the applied voltages. The applied voltages can include a gate voltage, a drain voltage and a substrate voltage. A first function for calculating the first number of the first traps can be determined using the numbers of the first traps and using the applied voltages. The first number of the first traps can be calculated using the first function and the operation time.

In an embodiment, in the measurement of the numbers of the first traps, the numbers of the first traps generated in the gate insulation layer can be measured with respect to time intervals during which applied voltages are changed. For example the applied voltages, such as the gate voltage and the drain voltage, can be toggled. The first number of the first traps accumulated in the gate insulation layer can be calculated by adding the measured numbers of the first traps. Moreover, in an embodiment, the first number of the first traps can be calculated by multiplying the first function by the operation time.

In an embodiment, in the calculation of the second number of the second traps, the numbers of the second traps generated at the interface can be measured using the applied voltages. A second function for calculating the second number of the second traps can be determined using the numbers of the second traps and using the applied voltages. The second number of the second traps can be calculated using the second function with respect to the operation time.

In an embodiment, in the measurement of the numbers of the second traps generated at the interface, the numbers of the second traps generated at the interface can be measured with respect to time intervals by varying the applied voltages. The second number of the second traps accumulated at the interface can be calculated by adding the measured numbers of the second traps. In an embodiment, the second number of the second traps can be calculated by multiplying the second function by the operation time.

In an embodiment, one or more functions for calculating a variation of a drain saturation current, a variation of a threshold voltage, a variation of a sub-threshold slope, or the like of the semiconductor device can be determined with respect to the operation time using the first number of the first traps and the second number of the second traps. Then, the variation of the drain saturation current can be calculated relative to the operation time using the determined function.

Another embodiment includes a method of detecting a degradation of a MOS transistor. In the method of detecting the degradation of the MOS transistor, a first period of a gate voltage and a drain voltage are determined in accordance with an operation mode of the MOS transistor. The number of first traps generated in a gate insulation layer of the MOS transistor is measured during the first period. The number of second traps generated at an interface between the gate insulation layer and a substrate is measured during the first period. The first number of the first traps and the second number of the second traps are calculated over an operation time of the MOS transistor using the number of the first trap and the number of the second traps during the first period. The degradation of the MOS transistor is calculated over the operation time using the first number of the first traps and the second number of the second traps.

In an embodiment, in the measurement of the number of the first traps during the first period, the numbers of the first traps generated in the gate insulation layer can be measured with respect to time intervals by varying applied voltages. The first number of the first traps accumulated in the gate insulation layer can be calculated by adding the measured numbers of the first traps.

In an embodiment, in the measurement of the number of the second traps during the first period, the numbers of the second traps generated in the interface can be measured with respect to time intervals by varying the applied voltages. The second number of the second traps accumulated at the interface can be calculated by adding the measured numbers of the second traps.

In an embodiment, a variation value of a drain saturation current of the MOS transistor, a threshold voltage of the MOS transistor, a sub-threshold slope of the MOS transistor, or the like can be calculated relative to the operation time using the first number of the first traps and the second number of the second traps.

Another embodiment includes a method of detecting a degradation of an integrated circuit. In the method of detecting the degradation of the integrated circuit, the first number of first traps accumulated in gate insulation layers of MOS transistors is calculated with respect to applied voltages and operation times of the MOS transistors. The second number of second traps accumulated at interfaces between the gate insulation layers and a substrate is calculated with respect to the applied voltages and the operation times. Degradations of the MOS transistors are calculated relative to the operation times using the first number of the first traps and the second number of the second traps. The degradation of the integrated circuit is calculated using the degradations of the MOS transistors.

In an embodiment, parameters for detecting the degradation of the integrated circuit can be determined during an initial operation of the integrated circuit.

In an embodiments, it can be identified whether the integrated circuit meets predetermined requirements or not.

In an embodiment, the degradation of the semiconductor device such as the MOS transistor can be detected with respect to the operation time of the semiconductor device. Further, the degradation of the integrated circuit having MOS transistors can also be detected based on the detected degradations of the MOS transistors. Therefore, desired requirements of the MOS transistor and the integrated circuit, for example, a life time, a reliability and operation characteristics can be detected.

The foregoing is illustrative of example embodiments, and is not to be construed as limiting thereof. Although various embodiments have been described, those skilled in the art will readily appreciate that many modifications are possible in the example embodiments without materially departing from the novel teachings and advantages within the scope of the following claims. Accordingly, all such modifications are intended to be included within the scope of the following claims. Moreover, in the claims, means-plus-function clauses are intended to cover the structures described herein as performing the recited function and not only structural equivalents but also equivalent structures. Therefore, it is to be understood that the foregoing description is illustrative and is not to be construed as limited to the specific embodiments disclosed, and that modifications to the disclosed embodiments, as well as other embodiments, are intended to be included within the scope of the following claims.

What is claimed is:

1. A method of detecting a degradation of a semiconductor device, comprising:
    calculating a first number of first traps accumulated in a gate insulation layer of the semiconductor device over an operation time of the semiconductor device;
    calculating the second number of second traps accumulated at an interface between the gate insulation layer and a substrate over the operation time; and
    calculating the degradation of the semiconductor device relative to the operation time using the first number of the first traps and the second number of the second traps.

2. The method of claim 1, wherein calculating the first number of the first traps comprises:
    measuring numbers of the first traps generated in the gate insulation layer by applying at least one voltage to the semiconductor device;
    determining a first function using the measured numbers of the first traps and using the at least one voltage; and
    calculating the first number of the first traps using the first function and the operation time.

3. The method of claim 2, wherein measuring the numbers of the first traps generated in the gate insulation layer comprises:
    measuring the numbers of the first traps generated in the gate insulation layer with respect to time intervals by varying the at least one voltage; and
    calculating the first number of the first traps accumulated in the gate insulation layer by adding the measured numbers of the first traps over the time intervals.

4. The method of claim 2, wherein the first number of the first traps is calculated by multiplying the first function by the operation time.

5. The method of claim 1, wherein calculating the second number of the second traps comprises:
    measuring the numbers of the second traps generated at the interface by applying at least one voltage to the semiconductor device;
    determining a second function using the measured numbers of the second traps and using the at least one voltage; and
    calculating the second number of the second traps using the second function and the operation time.

6. The method of claim 5, wherein measuring the numbers of the second traps generated at the interface comprises:
    measuring the numbers of the second traps generated at the interface with respect to unit time intervals by varying the at least one voltage; and
    calculating the second number of the second traps accumulated at the interface by adding the measured numbers of the second traps over the time intervals.

7. The method of claim 5, wherein the second number of the second traps is calculated by multiplying the second function by the operation time.

8. The method of claim 1, further comprising:
determining a third function for calculating a variation of a drain saturation current of the semiconductor device with respect to the operation time using the first number of the first traps and the second number of the second traps; and
calculating the variation of the drain saturation current relative to the operation time using the third function.

9. The method of claim 1, further comprising:
determining a fourth function for calculating a variation of a threshold voltage of the semiconductor device with respect to the operation time using the first number of the first traps and the second number of the second traps; and
calculating the variation of the threshold voltage relative to the operation time using the fourth function.

10. The method of claim 1, further comprising:
determining a fifth function for calculating a variation of a sub-threshold slope of the semiconductor device with respect to the operation time using the first number of the first traps and the second number of the second traps; and
calculating the variation of the sub-threshold slope relative to the operation time using the fifth function.

11. A method of detecting a degradation of a transistor, comprising:
determining a first time period of applying at least one voltage in accordance with an operation mode of the transistor;
measuring a number of first traps generated in a gate insulation layer of the transistor during the first time period;
measuring a number of second traps generated at an interface between the gate insulation layer and a substrate during the first time period;
calculating a first number of the first traps and a second number of the second traps over an operation time of the transistor using the measured number of the first traps and the measured number of the second traps during the first period; and
calculating the degradation of the transistor relative to the operation time using the first number of the first traps and the second number of the second traps.

12. The method of claim 11, wherein measuring the number of the first traps during the first period comprises:
measuring the numbers of the first traps generated in the gate insulation layer over time intervals by varying the at least one voltage; and
calculating the first number of the first traps accumulated in the gate insulation layer by adding the measured numbers of the first traps over the time intervals.

13. The method of claim 11, wherein measuring the number of the second traps during the first period comprises:
measuring the numbers of the second traps generated in the interface over time intervals by varying the at least one voltage; and
calculating the second number of the second traps accumulated at the interface by adding the measured numbers of the second traps over the time intervals.

14. The method of claim 11, further comprising:
calculating a variation value of a drain saturation current of the transistor over the operation time using the first number of the first traps and the second number of the second traps.

15. The method of claim 11, further comprising:
calculating a variation value of a threshold voltage of the transistor over the operation time using the first number of the first traps and the second number of the second traps.

16. The method of claim 11, further comprising:
calculating a variation of a sub-threshold slope of the transistor over the operation time using the first number of the first traps and the second number of the second traps.

17. A method of detecting a degradation of an integrated circuit, comprising:
calculating a first number of first traps accumulated in gate insulation layers of transistors with respect to voltages applied to the transistors and operation times of the transistors;
calculating a second number of second traps accumulated at interfaces between the gate insulation layers and a substrate with respect to the voltages applied to the transistors and the operation times of the transistors;
calculating degradations of the transistors over the operation times using the first number of the first traps and the second number of the second traps; and
calculating the degradation of the integrated circuit using the degradations of the transistors.

18. The method of claim 17, further comprising:
determining parameters for detecting the degradation of the integrated circuit during an initial operation of the integrated circuit.

19. The method of claim 17, further comprising:
identifying whether the integrated circuit meets desired requirements.

20. The method of claim 17, wherein calculating the first number of the first traps comprises:
measuring numbers of the first traps generated in the gate insulation layers using a gate voltage, a drain voltage and a substrate voltage as the voltages applied to the transistors;
determining a first function using the measured numbers of the first traps and using the gate voltages, the drain voltages and the substrate voltage; and
calculating the first number of the first traps using the first function and the operation times of the transistors; and
wherein calculating the second number of the second traps comprises:
measuring numbers of the second traps generated at the interface using the gate voltage, the drain voltage and the substrate voltage as the voltages applied to the transistors;
determining a second function using the measured numbers of the second traps and using the gate voltage, the drain voltage and the substrate voltage; and
calculating the second number of the second traps using the second function and the operation times of the transistors.

21. The method of claim 1, further comprising:
identifying whether the semiconductor device meets desired requirements, and
fabricating an integrated circuit from the semiconductor device if the semiconductor device meets the desired requirements.

22. The method of claim 11, further comprising:
identifying whether the transistor meets desired requirements, and
fabricating an integrated circuit from the transistor if the transistor meets the desired requirements.

23. The method of claim 17, further comprising:
identifying whether the semiconductor device meets desired requirements, and
fabricating an integrated circuit from the semiconductor device if the semiconductor device meets the desired requirements.

* * * * *